United States Patent
Yodo (10) Patent No.: US 10,265,805 B2
(45) Date of Patent: Apr. 23, 2019

(54) METHOD OF PROCESSING WORKPIECE

(71) Applicant: DISCO CORPORATION, Tokyo (JP)

(72) Inventor: Yoshiaki Yodo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/874,550

(22) Filed: Jan. 18, 2018

(65) Prior Publication Data

US 2018/0200830 A1   Jul. 19, 2018

(30) Foreign Application Priority Data

Jan. 18, 2017 (JP) ................................ 2017-006534

(51) Int. Cl.
| | |
|---|---|
| *B23K 26/53* | (2014.01) |
| *H01L 21/78* | (2006.01) |
| *B23K 26/06* | (2014.01) |
| *B23K 26/08* | (2014.01) |
| *B23K 26/00* | (2014.01) |
| *B23K 26/38* | (2014.01) |
| *B23K 26/57* | (2014.01) |
| *B23K 101/40* | (2006.01) |
| *H01L 21/304* | (2006.01) |
| *H01L 21/322* | (2006.01) |

(52) U.S. Cl.
CPC .......... *B23K 26/53* (2015.10); *B23K 26/0093* (2013.01); *B23K 26/0665* (2013.01); *B23K 26/0853* (2013.01); *B23K 26/38* (2013.01); *B23K 26/57* (2015.10); *B23K 2101/40* (2018.08); *H01L 21/304* (2013.01); *H01L 21/322* (2013.01); *H01L 21/78* (2013.01)

(58) Field of Classification Search
None
See application file for complete search history.

(56) References Cited

U.S. PATENT DOCUMENTS

| | | | | |
|---|---|---|---|---|
| 6,974,726 | B2* | 12/2005 | Dani | ...................... H01L 21/78 |
| | | | | 257/620 |
| 7,838,331 | B2* | 11/2010 | Komura | ............... B23K 26/009 |
| | | | | 438/106 |
| 7,892,949 | B2* | 2/2011 | Abe | .................. H01L 21/67092 |
| | | | | 438/462 |
| 8,603,351 | B2* | 12/2013 | Sakamoto | ......... H01L 21/67132 |
| | | | | 216/62 |
| 8,809,166 | B2* | 8/2014 | Buenning | ............... H01L 21/78 |
| | | | | 438/463 |

(Continued)

FOREIGN PATENT DOCUMENTS

JP    2002-192370 A    7/2002

*Primary Examiner* — Andres Munoz
(74) *Attorney, Agent, or Firm* — Greer Burns & Crain, Ltd.

(57) ABSTRACT

Disclosed herein is a method of processing a workpiece having a plurality of streets provided on a face side thereof, the method including: a laser beam applying step of applying a laser beam having a wavelength that is transmittable through the workpiece along the streets while focusing the laser beam at a point within the workpiece, thereby forming modified layers in the workpiece along the streets and cracks extending from the modified layers to the face side; and a cutting step of, thereafter, cutting the workpiece from a reverse side thereof along the streets while supplying the workpiece with a cutting fluid, thereby removing the modified layers from the workpiece.

3 Claims, 6 Drawing Sheets

(56) References Cited

U.S. PATENT DOCUMENTS

| | | | | |
|---|---|---|---|---|
| 9,093,518 B1* | 7/2015 | Lei | ...................... | H01L 21/6836 |
| 9,130,057 B1* | 9/2015 | Kumar | .............. | H01L 21/67092 |
| 9,147,624 B2* | 9/2015 | Mackh | .................... | H01L 23/29 |
| 9,165,832 B1* | 10/2015 | Papanu | .................. | H01L 21/78 |
| 9,472,458 B2* | 10/2016 | Doub | ................ | H01L 21/67092 |
| 9,812,362 B2* | 11/2017 | Takeda | ................ | H01L 21/6836 |
| 2005/0006728 A1* | 1/2005 | Shizuno | .............. | H01L 21/6835 |
| | | | | 257/642 |
| 2007/0066044 A1* | 3/2007 | Abe | .................... | H01L 21/6835 |
| | | | | 438/612 |
| 2009/0215245 A1* | 8/2009 | Nakamura | ........... | B23K 26/032 |
| | | | | 438/463 |
| 2012/0156816 A1* | 6/2012 | Okamura | ............. | B28D 5/0011 |
| | | | | 438/33 |
| 2012/0244682 A1* | 9/2012 | Tanaka | ............... | B23K 26/0093 |
| | | | | 438/464 |

\* cited by examiner

METHOD OF PROCESSING WORKPIECE

BACKGROUND OF THE INVENTION

Field of the Invention

The present invention relates to a method of processing a workpiece such as a semiconductor wafer or the like.

Description of the Related Art

There has been put to practical use a processing method called "stealth dicing" in which a laser beam having a wavelength that is transmittable through a workpiece such as a semiconductor wafer or the like is applied to the workpiece from its reverse side while being focused at points within the workpiece which correspond to projected dicing lines referred to as streets, thereby forming modified layers in the workpiece, and then external forces are applied to the modified layers to divide the workpiece into individual device chips (see, for example, Japanese Patent No. 3408805 for details).

SUMMARY OF THE INVENTION

According to stealth dicing, it is preferable to process a workpiece with a laser beam under such conditions that produce cracks in the workpiece which extend from modified layers to a face side of the workpiece for making it easier to divide the workpiece into device chips. If modified layers are left in device chips fabricated after the laser-processed workpiece has been ground to a thin profile, then the flexural strength of the device chips is lowered.

It is therefore an object of the present invention to provide a method of processing a workpiece to divide the workpiece into individual device chips by way of stealth dicing while increasing the flexural strength of the device chips without making it less easy to divide the workpiece into device chips.

In accordance with an aspect of the present invention, there is provided a method of processing a workpiece having a plurality of streets provided on a face side thereof, the method including: a laser beam applying step of applying a laser beam having a wavelength that is transmittable through the workpiece to a reverse side of the workpiece along the streets while focusing the laser beam at a point within the workpiece, thereby forming modified layers in the workpiece along the streets and cracks extending from the modified layers to the face side; and a cutting step of cutting the workpiece from a reverse side thereof along the streets while supplying the workpiece with a cutting fluid, thereby removing the modified layers from the workpiece, after performing said laser beam applying step.

Preferably, in the cutting step, the workpiece is cut while a lowermost position on the cross-sectional shape of a cutting edge of the cutting blade positionally deviates from the cracks in a direction perpendicular to a direction along which the streets extend, thereby preventing cut chips together with the cutting fluid from entering the cracks.

Preferably, the cross-sectional shape of the cutting edge of the cutting blade is a centrally recessed shape where the center of the cutting edge is recessed between projecting end ridges or a one-sided unsymmetrical slanted shape where an essentially flat surface is oblique from one side to another and, in the cutting step, the workpiece is cut while the center of the cutting blade in thicknesswise directions thereof is positionally aligned with the cracks.

Preferably, the cross-sectional shape of the cutting edge of the cutting blade is a round shape and, in the cutting step, the workpiece is cut while the center of the cutting blade in thicknesswise directions thereof positionally deviates from the cracks in the direction perpendicular to the direction along which the streets extend.

According to the present invention, it is easier for the workpiece to be divided into individual device chips on account of the cracks, and the flexural strength of device chips divided from the workpiece is increased because the modified layers have been removed.

Since, in the cutting step, the workpiece is cut while the lowermost position on the cross-sectional shape of the cutting edge of the cutting blade positionally deviates from the cracks in the direction perpendicularly to the direction along which the streets extend, cut chips together with the cutting fluid are prevented from entering the cracks, and hence dirt is prevented from being deposited on side faces of device chips divided from the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Like or corresponding parts are denoted by like or corresponding reference characters throughout views.

Figure 1:
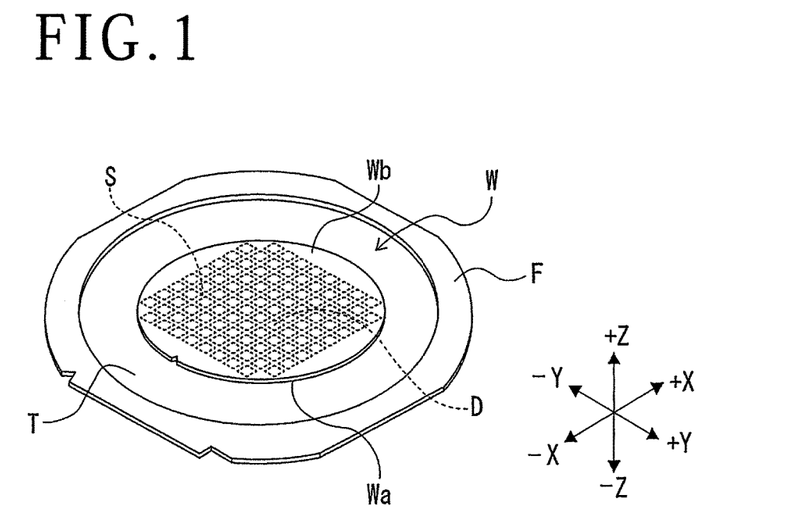
FIG. 1 is a perspective view depicting a workpiece by way of example.

A method of processing a workpiece W (FIG. 1) according to the present invention is carried out to divide the workpiece W into individual device chips. The various steps of the method will be described below. The workpiece W depicted in FIG. 1 is a disk-shaped semiconductor wafer made of a silicon substrate or the like, for example, and has on a face side Wa thereof a plurality of devices D disposed in respective areas of the face side Wa that are demarcated by a grid of streets S. The face side Wa of the workpiece W, which faces downwardly in a −Z-axis direction in FIG. 1, is affixed to the adhesive surface of a dicing tape T that is larger in diameter than the workpiece W, and hence is protected by the dicing tape T. The adhesive surface of the dicing tape T has an outer peripheral region to which an annular frame F having a circular opening defined therein is affixed. The workpiece W is supported on the annular frame F by the dicing tape T such that the workpiece W is positioned in the circular opening of the annular frame F, and can be handled through the annular frame F.

(1) Laser Beam Applying Step

Figure 2:
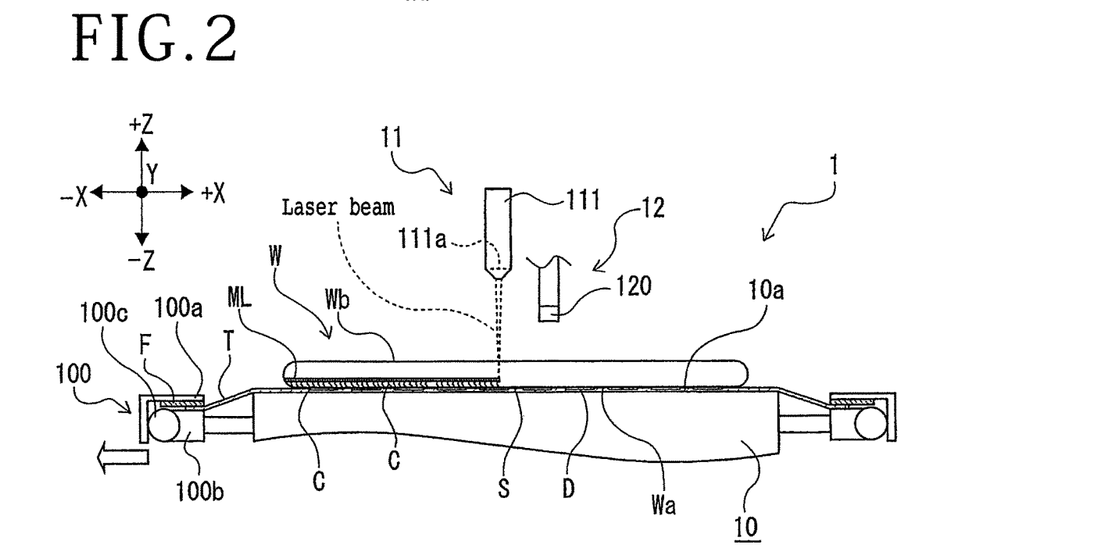
FIG. 2 is a cross-sectional view depicting the manner in which modified layers and cracks are being produced in the workpiece by laser beam applying means.

FIG. 2 depicts a laser processing apparatus 1 that forms modified layers in the workpiece W. The laser processing apparatus 1 includes at least a chuck table 10 for holding the workpiece W under suction thereon and laser beam applying means 11 for applying a laser beam to the workpiece W held on the chuck table 10. The chuck table 10, which has a circular contour, for example, has a holding surface 10a made of a porous material or the like for holding the workpiece W under suction thereon. The chuck table 10 is rotatable about a vertical central axis thereof that extends in Z-axis directions, and reciprocally movable in X-axis directions by processing feed means, not depicted.

The laser processing apparatus 1 also includes a plurality of (four, for example) fastening clamps (two depicted in FIG. 2) 100 angularly spaced at equal intervals around the chuck table 10. Each of the fastening clamps 100 includes a gripping plate 100a and a gripping base 100b. The gripping plate 100a is angularly movable about a pivot shaft 100c and normally biased to move toward the gripping base 100b by a spring or the like, not depicted. The annular frame F and the dicing tape T are sandwiched between the lower surfaces of the gripping plates 100a and the upper surfaces of the gripping bases 100b.

The laser beam applying means 11 includes a laser beam oscillator, not depicted, for oscillating and emitting a laser beam having a wavelength that is transmittable through the workpiece W. The laser beam emitted by the laser beam oscillator is transmitted through a transmitting optical system such as an optical fiber or the like to a condensing lens 111a in a beam condenser 111. The condensing lens 111a applies the laser beam to the workpiece W held on the chuck table 10 and focuses the laser beam accurately in a predetermined vertical position in the workpiece W.

Alignment means 12 for detecting a street S of the workpiece W held on the chuck table 10 is disposed in the vicinity of the laser beam applying means 11, for example. The alignment means 12 includes infrared radiation applying means, not depicted, for applying an infrared radiation to the workpiece W, and an infrared camera 120 that includes an optical system for guiding the infrared radiation and an imaging device (infrared charge coupled device (CCD)) for generating an electric signal representing an image of the workpiece W based on an infrared radiation reflected from the workpiece W. The alignment means 12 performs an image processing process such as pattern matching or the like on the image acquired by the infrared camera 120 to detect a street S on the surface Wa of the workpiece W. The alignment means 12 and the laser beam applying means 11 are combined as an integral assembly, and are movable together in Y-axis directions and Z-axis directions.

In the laser beam applying step, as depicted in FIG. 2, the workpiece W supported on the annular frame F is held under suction on the chuck table 10 such that a reverse side Wb of the workpiece W faces upwardly. The annular frame F is fastened in place by the fastening clamps 100.

Then, the workpiece W held on the chuck table 10 is fed in an −X-axis direction (forward direction), and a street S extending in the X-axis directions on the face side Wa of the workpiece W is detected by the alignment means 12. Though the face side Wa of the workpiece W faces downwardly and does not face the alignment means 12 directly, the infrared camera 120 can image the street S with an infrared radiation applied by the infrared radiation applying means and transmitted through the reverse side Wb of the workpiece W and reflected from the face side Wa thereof. The alignment means 12 then performs an image processing process such as pattern matching or the like on the image of the street S acquired by the infrared camera 120, and detects the coordinate position of the street S, to which the laser beam is to be applied, in the Y-axis directions from the processed image.

Upon detection of the position of the street S, the laser beam applying means 11 is indexing-fed in the Y-axis directions to position the street S in alignment with the beam condenser 111 in the Y-axis directions. The street S is positioned such that its central line is positioned directly below the condensing lens 111a of the beam condenser 111, for example. In order to make it easier to divide the workpiece W into device chips, it is preferable to process the workpiece W with the laser beam under such conditions that produce modified layers in the workpiece W and cracks in the workpiece W which extend from the modified layers to the face side Wa of the workpiece W. To this end, the output power and repetitive frequency of the laser beam from the laser beam applying means 11 are set to conditions that produce cracks which extend from the modified layers to the face side Wa of the workpiece W.

One example of such conditions is given as follows.
Wavelength: 1342 nm
Repetitive frequency: 90 kHz
Average output power: 2 W
Processing feed speed: 700 nm/second Then, the focused point of the laser beam that is transmittable through the workpiece W is positioned at a predetermined vertical position in the workpiece W which corresponds to the street S, i.e., at a vertical position beneath a substantially middle position in the thicknesswise directions (Z-axis directions) of the workpiece W in the illustrated embodiment, by the beam condenser 111. The laser beam applying means 11 applies the laser beam to the reverse side Wb of the workpiece W along the street S as the chuck table 10 is processing-fed in a −X-axis direction, thereby forming modified layers ML in the workpiece W along the street S. The laser beam oscillated by the laser beam oscillator and applied to the workpiece W is transmittable through the workpiece W before the laser beam reaches the focused point. However, once the laser beam has reached the focused point, it becomes highly absorbable locally by the workpiece W. Therefore, the region of the workpiece W in the vicinity of the focused point absorbs the laser beam and is modified thereby, forming modified layers ML having a certain length chiefly upwardly from the focused point. As depicted in FIG. 2, as the modified layers ML are formed in the workpiece W, a number of minute cracks C extending from the modified layers ML to the face side Wa are also formed in the workpiece W. Cracks C may extend from the modified layers ML not only to the face side Wa, but also to the reverse side Wb of the workpiece W.

The workpiece W is continuously processing-fed at a predetermined processing speed in the −X-axis direction, forming a succession of modified layers ML spaced at very small intervals in the X-axis directions along the street S and also a number of cracks C extending from the modified layers ML to the face side Wa. The workpiece W is continuously moved in the −X-axis direction to a given position by the chuck table 10 until the laser beam has been applied to the workpiece W all the way along the street S.

Then, the laser beam applying means 11 stops applying the laser beam to the workpiece W, and the chuck table 10 temporarily stops to processing-feed the workpiece W in the −X-axis direction (forward direction). The laser beam applying means 11 is indexing-fed in one of the Y-axis directions, and another street S next to the street S irradiated with the laser beam is brought into positional alignment with the beam condenser 111 in the Y-axis directions. Then, the workpiece W is processing-fed in a +X-axis direction (backward direction), and the laser beam applying means 11 applies the laser beam to the reverse side Wb of the workpiece W all the way along the other street S in the same manner as when the workpiece W was processing-fed in the forward direction in the previous processing cycle. Thereafter, the workpiece W is irradiated with the laser beam along all the streets S in subsequent processing cycles, producing modified layers ML and cracks C in the workpiece W along all the streets S. Actually, the cracks C extend a short distance from the modified layers ML toward the reverse side Wb, though such crack extensions are omitted from illustration in FIGS. 2 and 3 and also in FIGS. 4 through 11 to be described later.

Figure 3:
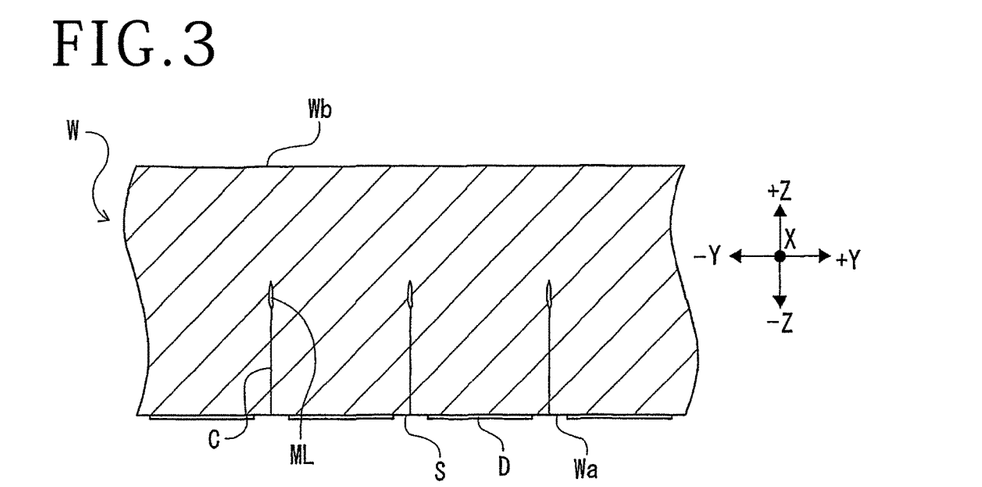
FIG. 3 is an enlarged fragmentary cross-sectional view of the workpiece in which modified layers and cracks are produced.

As depicted in FIG. 3, the width of the cracks C in the Y-axis directions is smaller than the width of the modified layers ML in the Y-axis directions. The cracks C and the modified layers ML are formed in alignment with the central line of each of the streets S extending in the X-axis directions. Each time the chuck table 10 switches from moving in the forward direction to moving in the backward direction, the vertical position in the workpiece W where the laser beam is focused by the beam condenser 111 may be changed, and the same street S may repeatedly be irradiated with the laser beam a plurality of times, thereby forming modified layers ML within the workpiece W in a plurality of tiers along the thicknesswise directions thereof.

The chuck table 10 is then turned 90 degrees about its own axis, and then the workpiece W is irradiated with the laser beam in the same manner as described above, thereby forming modified layers ML and cracks C all along the grid of streets S.

(2-1) Cutting Step According to First Embodiment

Figure 4:
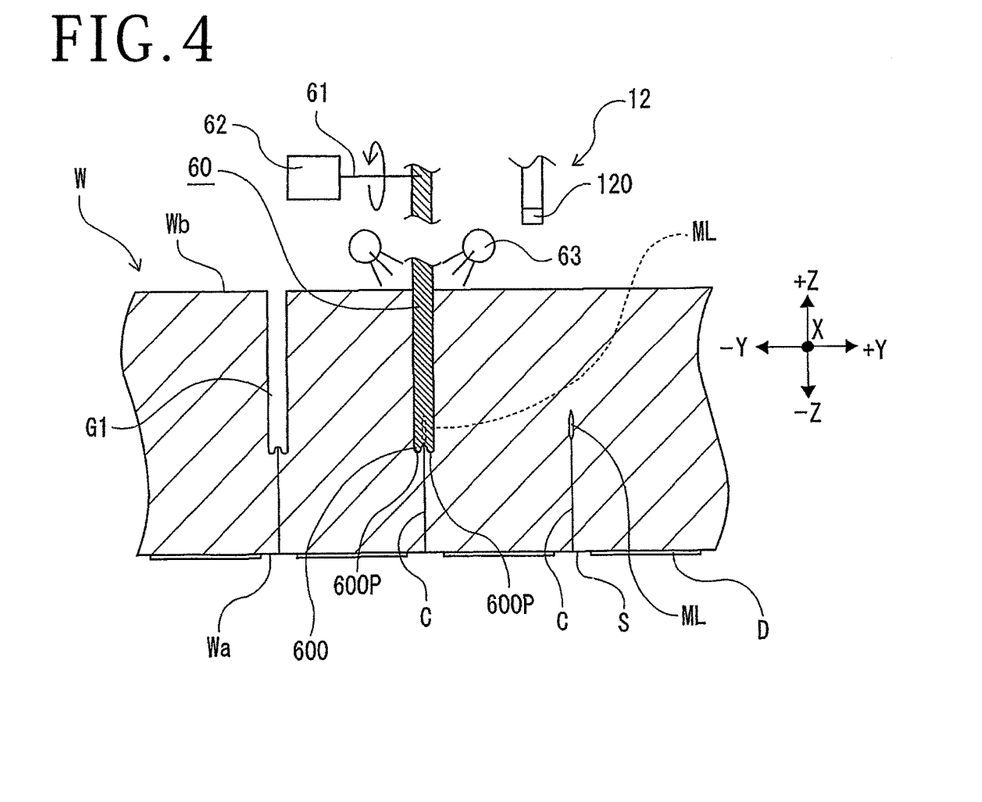
FIG. 4 is an enlarged fragmentary cross-sectional view depicting the manner in which the workpiece is cut by a cutting blade whose cutting edge has a centrally recessed vertical cross-sectional shape.

After the laser beam applying step, as depicted in FIG. 4, the workpiece W is cut from the reverse side Wb by a cutting blade 60 along a street S, removing the modified layers ML, while the workpiece W is being supplied with a cutting fluid. Specifically, the workpiece W has been delivered to a cutting apparatus equipped with the cutting blade 60, and held under suction on a chuck table, not depicted, with the reverse side Wb facing upwardly. The chuck table with the workpiece W held thereon is rotatable about a vertical central axis thereof that extends in Z-axis directions, and reciprocally movable in X-axis directions.

The cutting blade 60, partly depicted in FIG. 4, is an annular washer-type blade having a radially outer cutting edge 600 whose thickness ranges from approximately 30 to 40 μm. The cutting edge 600 has a centrally recessed vertical cross-sectional shape where the center of the cutting edge 600 in its thicknesswise directions is recessed radially inwardly of the cutting blade 60. The cutting blade 60 is not limited to a washer-type blade, but may be a hub-type blade including a base and a cutting edge disposed on an outer peripheral edge of the base.

The cutting blade 60 is mounted on a spindle 61 whose axis extends in directions (Y-axis directions) perpendicular to the directions (X-axis directions) along which the workpiece W is movable. When the spindle 61 is rotated at a high speed about its own axis by a motor 62 connected thereto, the cutting blade 60 is rotated about its own axis that extends in the Y-axis directions.

A street S along which the cutting blade 60 is to cut the workpiece W can be detected by an image processing process such as pattern matching or the like performed on the image acquired by the alignment means 12 depicted in FIG. 4 from the infrared camera 120.

In a cutting process, the workpiece W is cut by the cutting blade 60 while the workpiece W is being supplied with the cutting fluid mainly in a region being processed (also referred to as "processed region") which is kept in contact with the cutting blade 60. The cutting fluid is supplied to the processed region from two cutting fluid supply nozzles 63 depicted in FIG. 4. The cutting fluid supply nozzles 63 are disposed one on each side of the cutting blade 60 in the Y-axis directions, for example, and have respective ejection ports facing the respective side surfaces of the cutting blade 60. The cutting fluid supply nozzles 63 are held in fluid communication with a cutting fluid supply source, not depicted. The cutting blade 60, the alignment means 12, and the cutting fluid supply nozzles 63 are movable in ganged relation in the Y-axis directions and the Z-axis directions.

In the cutting step, the workpiece W is first fed in the −X-axis direction (toward the viewer of FIG. 4), and an image of the face side Wa of the workpiece W including a street S is captured by the infrared camera 120. The alignment means 12 performs an image processing process such as pattern matching or the like on the image and calculates the coordinate position of the street S in the Y-axis directions along which the cutting blade 60 is to cut into the workpiece W. Upon detection of the position of the street S, the cutting blade 60 is indexing-fed in one of the Y-axis directions and positioned into alignment with the street S along which to cut the workpiece W in the Y-axis directions. The cutting blade 60 is positioned with respect to the street S such that the central line of the street S will be positioned directly below the central recess in the cutting edge 600 of the cutting blade 60, i.e., the center in the thicknesswise directions (Y-axis directions in FIG. 4) of the cutting blade 60 will be aligned with the cracks C, for example. With the cutting blade 60 thus positioned with respect to the street S, lowermost areas 600P on the cross-sectional shape of the cutting edge 600 of the cutting blade 60 positionally deviate from the cracks C in the directions (Y-axis directions in FIG. 4) perpendicular to the directions (X-axis directions) along which the street S extends.

Figure 5:
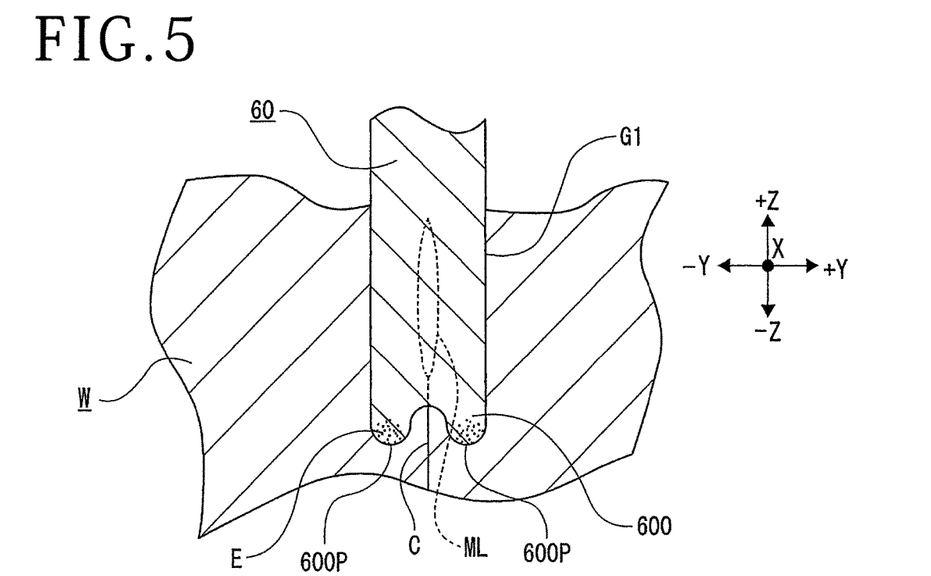
FIG. 5 is an enlarged fragmentary cross-sectional view depicting the manner in which cut chips are collected while the workpiece is cut by a cutting blade whose cutting edge has a centrally recessed vertical cross-sectional shape.

Then, the cutting blade 60 is lowered in the −Z-axis direction and brought into a vertical position where the cutting edge 600 of the cutting blade 60 is to cut slightly into the upper ends of the cracks C. Thereafter, the workpiece W is fed in the −X-axis direction at a predetermined cutting speed, and the motor 62 rotates the spindle 61 at a high speed clockwise as viewed from the +Y-axis direction. The cutting blade 60 fixed to the spindle 61 rotates at the high speed, cutting into the workpiece W from the reverse side Wb thereof along the street S. While the workpiece W is being cut, the cutting fluid supply nozzles 63 eject the cutting fluid to the processed region of the workpiece W which is kept in contact with the cutting blade 60 and neighboring regions. The cutting fluid ejected from the cutting fluid supply nozzles 63 cools and cleans the processed region, and removes cut chips E depicted in FIG. 5 from the workpiece W. Since the workpiece W is cut by the cutting blade 60 that is held at the vertical position where the cutting edge 600 of the cutting blade 60 is to cut slightly into the upper ends of the cracks C, as depicted in FIG. 5, the modified layers ML are removed from within the workpiece W by the cutting blade 60.

As a result of the cutting step, a groove G1 as depicted in FIG. 4 is cut in the workpiece W along the street S that extends in the X-axis directions. The groove G1 has its deepest areas positioned slightly below the upper ends of the cracks C and positionally deviating from the cracks C in the Y-axis directions.

Removing the modified layers ML with the cutting blade 60 in the manner described above is preferable for increasing the flexural strength (die strength) of device chips to be divided from the workpiece W. On the other hand, however, if the workpiece W with the cracks C formed therein that extend from the modified layers ML to the face side Wa is cut by a cutting blade to remove the modified layers ML, then though most of the cutting fluid that carries the cut chips E is discharged out of the workpiece W through the groove G1, some of the cutting fluid enters the cracks C, tending to contaminate side faces of the device chips that include the devices D. When the workpiece W is cleaned with cleaning water immediately after the cutting process is completed, because no sufficient gaps are present between the device chips, the cleaning water does not spread all over the side faces of the device chips and hence the side faces of the device chips cannot be cleaned thoroughly. Even if the workpiece W is cleaned after the gaps between the device chips are widened by an expanding apparatus, the dirt including cut chips E deposited on the side faces of the device chips has already been dried and stuck, and is difficult to remove. If the deposited dirt is left unremoved, then in a bonding step carried out after the processing method according to the present invention, the dirt may drop onto bonding pads and cause a bonding failure.

In view of the above problems, the inventor of the present invention has made research efforts and found that cut chips fall by gravity in the groove and tend to collect in the vicinity of the lowest position in the groove. The method of processing the workpiece W according to the present invention uses the cutting blade 60 with the cutting edge 600 that has the centrally recessed vertical cross-sectional shape where the center of the cutting edge 600 in its thicknesswise directions is recessed radially inwardly of the cutting blade 60, between two end ridges projecting radially outwardly on both sides of the recessed center and including the respective lowermost areas 600P. In the cutting step, while the workpiece W is cut by the cutting blade 60 to remove the modified layers ML, the lowermost areas 600P on the cross-sectional shape of the cutting edge 600 positionally deviate from the cracks C in the directions (Y-axis directions) perpendicular to the directions (X-axis directions) along which the street S extends, i.e., the center of the cutting edge 600 in its thicknesswise directions is positionally aligned with the cracks C. The cut chips E produced from cutting the workpiece W drop by gravity in the groove G1 and collect in the deepest areas of the groove G1 that positionally deviate from the cracks C in the Y-axis directions, as depicted in FIG. 5. Therefore, the cut chips E are prevented from entering the cracks C and from being deposited on the side faces of the device chips to be divided from the workpiece W. Accordingly, the flexural strength of the device chips is increased by the removal of the modified layers ML and failures are prevented from being caused in steps subsequent to the division of the workpiece W into the individual device chips.

When the workpiece W is fed to a predetermined position in the X-axis directions where the cutting blade 60 finishes cutting the screen S in the workpiece W, the workpiece W temporarily stops being fed in the −X-axis direction and the cutting blade 60 is separated from the workpiece W. Then, the workpiece W is moved in the +X-axis direction back to its original position. The cutting blade 60 is indexing-fed in the +Y-axis direction by a distance equal to the interval between two adjacent streets S, after which the workpiece W is cut by the cutting blade 60 along a next street S in the same manner as described above. The above cutting step is repeated to cut grooves G1 in the workpiece W all along the streets S in one direction, thereby removing the modified layers ML. Then, the workpiece W is turned 90 degrees about its own axis, and then cut to form grooves G1 therein all along the streets S in another direction perpendicular to the one direction, thereby removing the modified layers ML. In this manner, the grooves G1 are cut in the workpiece W all along the grid of streets S, thereby removing the modified layers ML.

Figure 6:
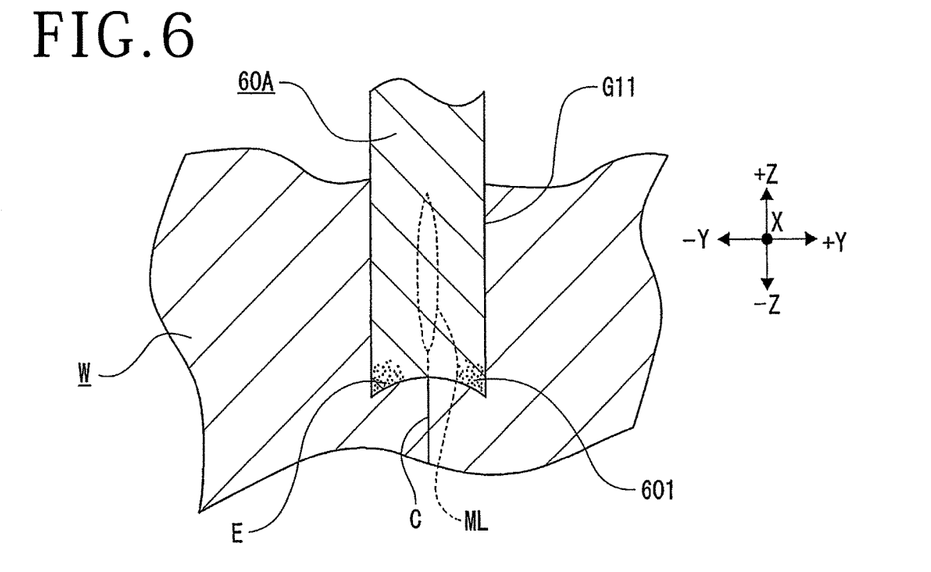
FIG. 6 is an enlarged fragmentary cross-sectional view depicting the manner in which cut chips are collected while the workpiece is cut by another cutting blade whose cutting edge has a centrally recessed vertical cross-sectional shape.
Figure 7:
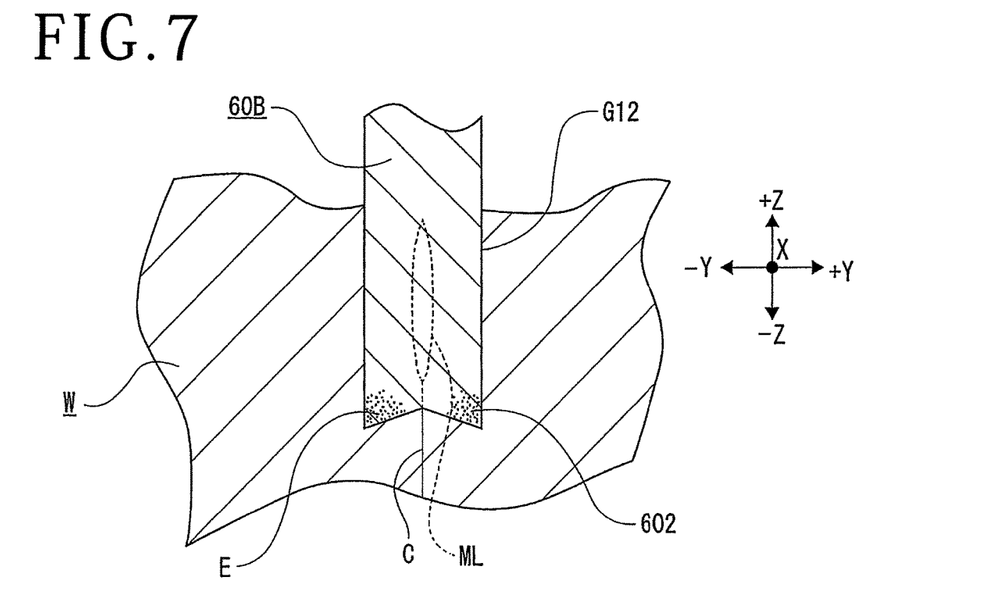
FIG. 7 is an enlarged fragmentary cross-sectional view depicting the manner in which cut chips are collected while the workpiece is cut by still another cutting blade whose cutting edge has a centrally recessed vertical cross-sectional shape.

The cutting blade used in the cutting step according to the first embodiment is not limited to the cutting blade 60 depicted in FIGS. 4 and 5, but may be a cutting blade 60A depicted in FIG. 6 or a cutting blade 60B depicted in FIG. 7. As depicted in FIG. 6, the cutting blade 60A has a cutting edge 601 that has a centrally recessed vertical cross-sectional shape where the center of the cutting edge 601 in its thicknesswise directions is recessed radially inwardly of the cutting blade 60A, between two end ridges projecting radially outwardly on both sides of the recessed center, and the recessed center is defined by a curved surface and has a gradient smaller than with the cutting blade 60. As depicted in FIG. 7, the cutting blade 60B also has a cutting edge 602 that has a centrally recessed vertical cross-sectional shape where the center of the cutting edge 602 in its thicknesswise directions is recessed radially inwardly of the cutting blade 60B, between two end ridges projecting radially outwardly on both sides of the recessed center, and the recessed center is defined by a pair of straight surfaces unlike the recessed center of the cutting blade 60A which is defined by a curved surface.

When either one of the cutting blades 60A and 60B, rather than the cutting blade 60, is used in the cutting step to cut a groove G11 depicted in FIG. 6 or a groove G12 depicted in FIG. 7 in the workpiece W and remove the modified layers ML from the workpiece W, the lowermost areas on the cross-sectional shape of the cutting edge positionally deviate from the cracks C in the directions (Y-axis directions) perpendicular to the directions (X-axis directions) along which the street S extends, and the center of the cutting edge in its thicknesswise directions is positionally aligned with the cracks C. The cut chips E produced from cutting the workpiece W drop by gravity in the groove G11 or G12 and collect in the deepest areas of the groove G11 or G12 that positionally deviate from the cracks C in the Y-axis directions, as depicted in FIG. 6 or 7. Therefore, the cut chips E are prevented from entering the cracks C and from being deposited on the side faces of the device chips to be divided from the workpiece W. Accordingly, the flexural strength of the device chips is increased by the removal of the modified layers ML and failures are preventing from being caused in steps subsequent to the division of the workpiece W into the individual device chips.

Figure 8:
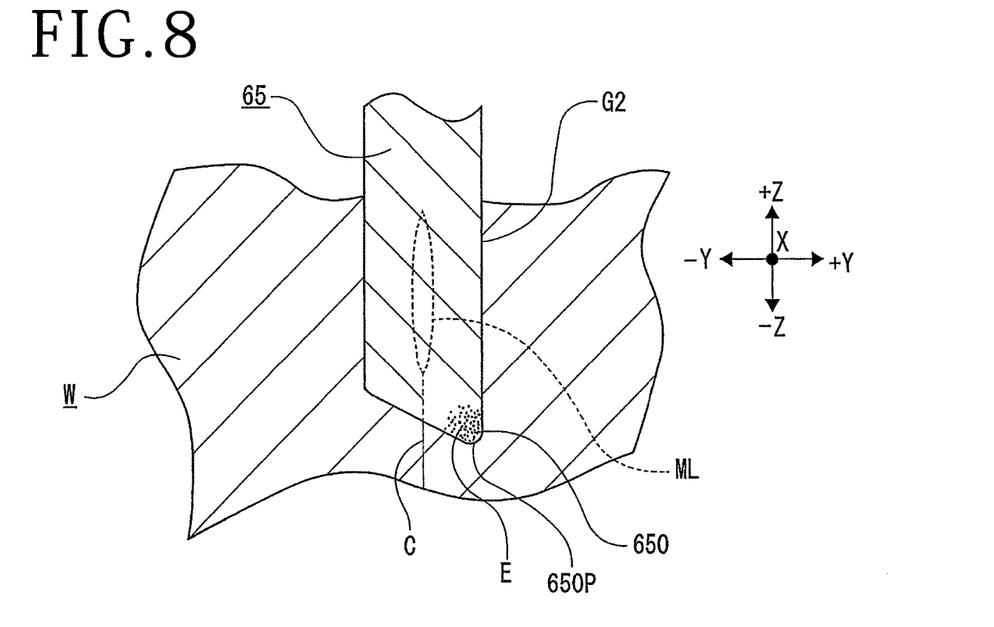
FIG. 8 is an enlarged fragmentary cross-sectional view depicting the manner in which cut chips are collected while the workpiece is cut by a cutting blade whose cutting edge has a one-sided slanted cross-sectional shape.

In the cutting step according to the first embodiment, the cutting blade 60 depicted in FIGS. 4 and 5 may be replaced with a cutting blade 65 depicted in FIG. 8. The cutting blade 65 depicted in FIG. 8 has a cutting edge 650 which has a one-sided unsymmetrical slanted cross-sectional shape, i.e., whose essentially flat surface is oblique from one side (−Y-axis direction) to the other (+Y-axis direction) at its tip end.

When the cutting blade 65, rather than the cutting blade 60, is used in the cutting step, to cut a groove G2 depicted in FIG. 8 in the workpiece W and remove the modified layers ML from the workpiece W, the lowermost area 650P on the cross-sectional shape of the cutting edge 650 positionally deviates from the cracks C in the directions (Y-axis directions) perpendicular to the directions (X-axis directions) along which the street S extends, and the center of the cutting edge in its thicknesswise directions is positionally aligned with the cracks C. The cut chips E produced from cutting the workpiece W drop by gravity in the groove G2 and collect in the deepest area of the groove G2 that positionally deviates from the cracks C in the +Y-axis direction, as depicted in FIG. 8. Therefore, the cut chips E are prevented from entering the cracks C and from being deposited on the side faces of the device chips to be divided from the workpiece W. Accordingly, the flexural strength of the device chips is increased by the removal of the modified layers ML and failures are prevented from being caused in steps subsequent to the division of the workpiece W into the individual device chips.

The workpiece W from which the modified layers ML have been removed and which has the grooves G1, for example, cut therein all along the streets S is delivered to an expanding apparatus, not depicted. In the expanding apparatus, the dicing tape T (FIG. 1) affixed to the workpiece W is stretched radially outwardly. External forces that are applied by the expanding apparatus to stretch the dicing tape T are applied to the cracks C in the workpiece W, thereby dividing the workpiece W from the cracks C into the individual device chips that carry the respective devices.

(2-2) Cutting Step According to Second Embodiment

Figure 9:
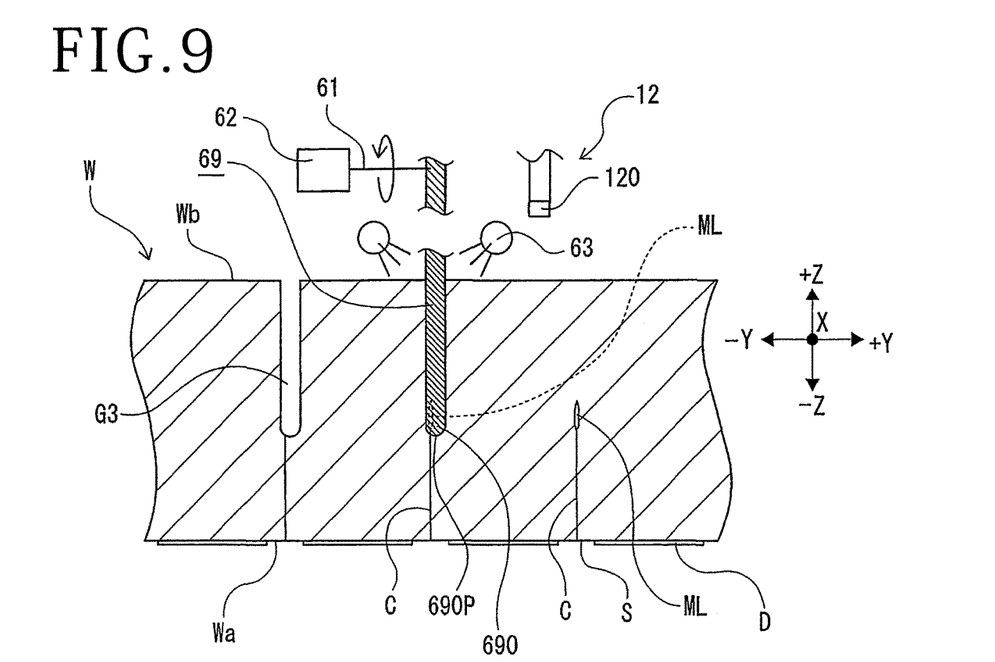
FIG. 9 is an enlarged fragmentary cross-sectional view depicting the manner in which the workpiece is cut by a cutting blade whose cutting edge has a round cross-sectional shape.

After the laser beam applying step described in (1) above, a cutting step according to a second embodiment may be carried out as follows:

As depicted in FIG. 9, a workpiece W delivered to a cutting apparatus having a cutting blade 69 is held under suction on a chuck table, not depicted, with the reverse side Wb thereof facing upwardly. The chuck table with the workpiece W thereon is rotatable about a vertical central axis thereof that extends in the Z-axis directions, and reciprocally movable in the X-axis directions.

The cutting blade 69, partly depicted in FIG. 9, is, for example, an annular washer-type blade having a radially outer cutting edge 690 whose thickness ranges from approximately 30 to 40 μm. The cutting blade 69 is mounted on the spindle 61. The cutting edge 690 has a round vertical cross-sectional shape, i.e., a substantially arcuate vertical cross-sectional shape in FIG. 9. When the spindle 61 is rotated at a high speed about its own axis by the motor 62 connected thereto, the cutting blade 69 is rotated about its own axis that extends in the Y-axis directions. The cutting blade 69 is not limited to a washer-type blade, but may be a hub-type blade.

A street S along which the cutting blade 69 is to cut the workpiece W can be detected by an image processing process such as pattern matching or the like performed on the image acquired by the alignment means 12 from the infrared camera 120. As depicted in FIG. 9, two cutting fluid supply nozzles 63 are disposed one on each side of the cutting blade 69 in the Y-axis directions, for example, and held in fluid communication with a cutting fluid supply source, not depicted. The cutting blade 69, the alignment means 12, and the cutting fluid supply nozzles 63 are movable in ganged relation in the Y-axis directions and the Z-axis directions.

In the cutting step according to the second embodiment, the workpiece W is first fed in the −X-axis direction (toward the viewer of FIG. 9), and the alignment means 12 detects the coordinate position of the street S in the Y-axis directions along which the cutting blade 69 is to cut into the workpiece W. Upon detection of the position of the street S, the cutting blade 69 is indexing-fed in one of the Y-axis directions and positioned into alignment with the street S along which to cut the workpiece W in the Y-axis directions. The cutting blade 69 is positioned with respect to the street S such that the center in the thicknesswise directions (Y-axis directions in FIG. 9) of the cutting blade 69 will positionally deviate from the cracks C in the directions (Y-axis directions in FIG. 9) perpendicular to the directions (X-axis directions) along which the street S extends. Since the cutting blade 69 whose cutting edge 690 has a round vertical cross-sectional shape is thus positioned with respect to the street S, a lowermost area 690P on the cross-sectional shape of the cutting edge 690 of the cutting blade 69 positionally deviates from the cracks C in the directions (Y-axis directions in FIG. 9) perpendicular to the directions (X-axis directions) along which the street S extends.

Figure 10:
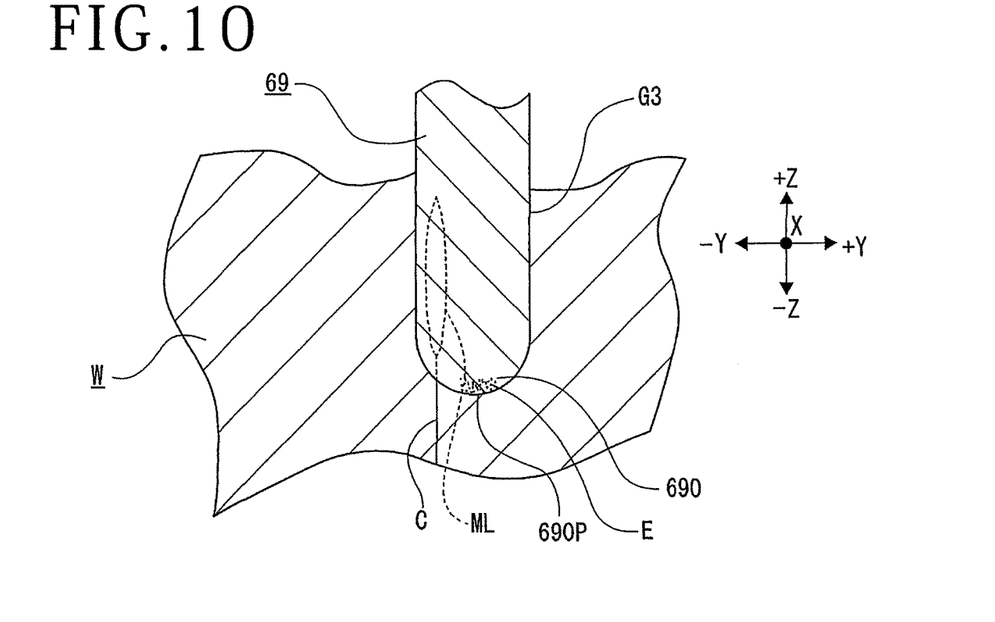
FIG. 10 is an enlarged fragmentary cross-sectional view depicting the manner in which cut chips are collected while the workpiece is cut by a cutting blade whose cutting edge has a round cross-sectional shape.

Then, the cutting blade 69 is lowered in the −Z-axis direction and brought into a vertical position where the cutting edge 690 of the cutting blade 69 is to cut slightly into the upper ends of the cracks C. Thereafter, the workpiece W is fed in the −X-axis direction at a predetermined cutting speed, and the motor 62 rotates the spindle 61 at a high speed clockwise as viewed from the +Y-axis direction. The cutting blade 69 fixed to the spindle 61 rotates at the high speed, cutting into the workpiece W from the reverse side Wb thereof along the street S. While the workpiece W is being cut, the cutting fluid supply nozzles 63 eject the cutting fluid to the processed region of the workpiece W which is kept in contact with the cutting blade 60 and neighboring regions. The cutting fluid ejected from the cutting fluid supply nozzles 63 cools and cleans the processed region, and removes cut chips E depicted in FIG. 10 from the workpiece W. Since the workpiece W is cut by the cutting blade 69 that is held at the vertical position where the cutting edge 690 of the cutting blade 69 is to cut slightly into the upper ends of the cracks C, as depicted in FIG. 10, the modified layers ML are cut off and removed from the workpiece W by the cutting blade 69. At the same time, a groove G3 is cut in the workpiece W as depicted in FIGS. 9 and 10.

The cutting step according to the second embodiment uses the cutting blade 69 with the cutting edge 690 that has the round vertical cross-sectional shape, and the cutting blade 69 is positioned with respect to the street S such that the center of the cutting blade 69 in its thicknesswise directions positionally deviates from the cracks C in the directions (Y-axis directions) perpendicular to the directions (X-axis directions) along which the street S extends, and the lowermost position 690P on the cross-sectional shape of the cutting edge 690 of the cutting blade 69 positionally deviates from the cracks C in the directions (Y-axis directions) perpendicular to the directions (X-axis directions) along which the street S extends. While the workpiece W is then cut by the cutting blade 69 to remove the modified layers ML, the cut chips E produced from cutting the workpiece W drop by gravity in the groove G3 and collect in the deepest area of the groove G3 that positionally deviates from the cracks C in the +Y-axis direction, as depicted in FIG. 10. Therefore, the cut chips E are prevented from entering the cracks C and from being deposited on the side faces of the device chips to be divided from the workpiece W. Accordingly, the flexural strength of the device chips is increased by the removal of the modified layers ML and failures are prevented from being caused in steps subsequent to the division of the workpiece W into the individual device chips.

Figure 11:
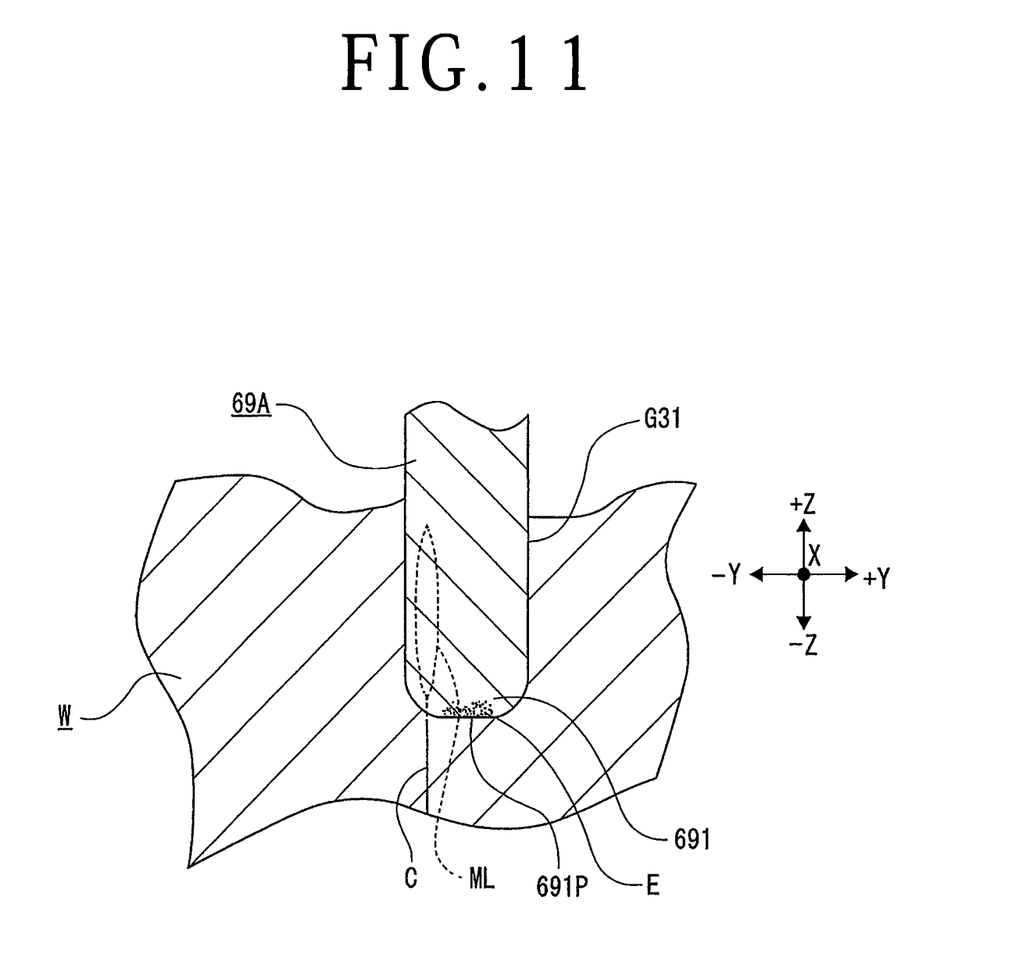
FIG. 11 is an enlarged fragmentary cross-sectional view depicting the manner in which cut chips are collected while the workpiece is cut by another cutting blade whose cutting edge has a round cross-sectional shape.

The cutting blade used in the cutting step according to the second embodiment is not limited to the cutting blade 69 depicted in FIGS. 9 and 10, but may be a cutting blade 69A depicted in FIG. 11, for example. As depicted in FIG. 11, the cutting blade 69A has a cutting edge 691 that has a round-corner vertical cross-sectional shape where a flat surface at a lowermost position 691P at the tip end has two round corners on opposite ends, i.e., is joined to both sides of the cutting blade 69A by two round corners.

When the cutting blade 69A, rather than the cutting blade 69, is used in the cutting step to cut a groove G31 in the workpiece W and remove the modified layers ML from the workpiece W, as depicted in FIG. 11, the cutting blade 69A is positioned with respect to the street S such that the center of the cutting edge 691 in its thicknesswise directions positionally deviates from the cracks C in the directions (Y-axis directions) perpendicular to the directions (X-axis directions) along which the street S extends, so that the lowermost position 691P on the cross-sectional shape of the cutting edge 691 positionally deviates from the cracks C in the directions (Y-axis directions) perpendicular to the directions (X-axis directions) along which the street S extends. While the workpiece W is then cut by the cutting blade 69A to remove the modified layers ML, the cut chips E produced from cutting the workpiece W drop by gravity in the groove G31 depicted in FIG. 11 and collect in the deepest area of the groove G31 that positionally deviates from the cracks C in the +Y-axis direction, as depicted in FIG. 11. Therefore, the cut chips E are prevented from entering the cracks C and from being deposited on the side faces of the device chips to be divided from the workpiece W. Accordingly, the flexural strength of the device chips is increased by the removal of the modified layers ML and failures are prevented from being caused in steps subsequent to the division of the workpiece W into the individual device chips.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a workpiece having a plurality of streets provided on a face side thereof, the method comprising:
    a laser beam applying step of applying a laser beam having a wavelength that is transmittable through the workpiece to a reverse side of the workpiece along the streets while focusing the laser beam at a point within the workpiece, thereby forming modified layers in the workpiece along the streets and cracks extending from the modified layers to the face side; and
    a cutting step of cutting the workpiece from the reverse side thereof along the streets while supplying the workpiece with a cutting fluid, thereby removing the modified layers from the workpiece, after performing said laser beam applying step,
    wherein, in the cutting step, the workpiece is cut while a lowermost position on the cross-sectional shape of a cutting edge of a cutting blade positionally deviates from the cracks in a direction perpendicular to a direction along which the streets extend, thereby preventing the cutting fluid and cut chips from entering the cracks.

2. The method according to claim 1,
    wherein the cross-sectional shape of the cutting edge of the cutting blade is a centrally recessed shape where the center of the cutting edge is recessed between projecting end ridges or a one-sided unsymmetrical slanted shape where an essentially flat surface is oblique from one side to another; and
    in the cutting step, the workpiece is cut while the center of the cutting blade in thicknesswise directions thereof is positionally aligned with the cracks.

3. The method according to claim 1,
    wherein the cross-sectional shape of the cutting edge of the cutting blade is a round shape; and
    in the cutting step, the workpiece is cut while the center of the cutting blade in thicknesswise directions thereof positionally deviates from the cracks in the direction perpendicular to the direction along which the streets extend.

* * * * *